(12) United States Patent
Schulze et al.

(10) Patent No.: US 7,982,289 B2
(45) Date of Patent: Jul. 19, 2011

(54) WAFER AND A METHOD FOR MANUFACTURING A WAFER

(75) Inventors: Hans-Joachim Schulze, Ottobrunn (DE); Hans-Joerg Timme, Ottobrunn (DE); Helmut Strack, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/967,866

(22) Filed: Dec. 14, 2010

(65) Prior Publication Data

US 2011/0079882 A1      Apr. 7, 2011

Related U.S. Application Data

(62) Division of application No. 11/864,483, filed on Sep. 28, 2007, now Pat. No. 7,879,699.

(51) Int. Cl.
   *H01L 29/167* (2006.01)
   *H01L 21/265* (2006.01)

(52) U.S. Cl. .................. 257/607; 438/520

(58) Field of Classification Search ............ 438/514, 438/520, 528, 918; 257/549, 607; 117/84, 117/94
See application file for complete search history.

(56) References Cited

U.S. PATENT DOCUMENTS

| | | |
|---|---|---|
| 4,851,358 A | 7/1989 | Huber |
| 6,022,793 A | 2/2000 | Wijaranakula et al. |
| 6,043,516 A | 3/2000 | Schulze |
| 6,090,698 A | 7/2000 | Lee |
| 6,277,501 B1 | 8/2001 | Fujikawa |
| 6,355,493 B1 | 3/2002 | Usenko |
| 6,461,933 B2 | 10/2002 | Houston |
| 6,569,749 B1 | 5/2003 | Wijaranakula et al. |
| 6,593,173 B1 | 7/2003 | Anc et al. |
| 7,112,509 B2 | 9/2006 | Erokhin et al. |
| 2004/0224477 A1 | 11/2004 | Erokhin et al. |
| 2005/0088257 A1 | 4/2005 | Ruby et al. |
| 2008/0246055 A1 | 10/2008 | Schulze et al. |
| 2009/0051013 A1 | 2/2009 | Schulze |
| 2009/0087631 A1 | 4/2009 | Schulze et al. |
| 2009/0087632 A1 | 4/2009 | Schulze et al. |
| 2009/0305486 A1 | 12/2009 | Schulze et al. |

FOREIGN PATENT DOCUMENTS

| | | |
|---|---|---|
| DE | 10 2006 002 903 A1 | 8/2007 |
| DE | 697 36 900 T2 | 9/2007 |
| EP | 0 833 388 A2 | 4/1998 |
| EP | 0 948 037 A1 | 10/1999 |
| EP | 1 677 344 A1 | 7/2006 |
| WO | WO 99/21222 | 4/1999 |

OTHER PUBLICATIONS

European Search Report, Application No. 08015269.7-1235 / 2043140, Applicant: Infineon Technologies AG, Aug. 18, 2009, 8 pages.
U.S. Office Action U.S. Appl. No. 11/864,584, Applicant Hans-Joachim Schulze, mailed Sep. 15, 2009, 18 pages.
Kovacevic, I., et al., "Vacancy-related complexes in neutron-irradiated silicon," Journal of Physics: Condensed Matter, May 20, 2005, pp. S2229-S2235, Institute of Physics Publishing, UK.

(Continued)

*Primary Examiner* — Calvin Lee
(74) *Attorney, Agent, or Firm* — Slater & Matsil, L.L.P.

(57) ABSTRACT

A wafer includes a wafer frontside and a region adjacent to the device surface, wherein the region includes vacancy-oxygen complexes and the wafer frontside includes a predetermined surface structure to form thereon a device with a desired property.

18 Claims, 12 Drawing Sheets

OTHER PUBLICATIONS

Markevich, V.P., et al., "Interaction of self-interstitials with oxygen-related defects in electron-irradiated Ge crystals," Materials Science in Semiconductor Processing, ScienceDirect, 2006, pp. 613-618, Elsevier Ltd.

Markevich, V.P., "A comparative study of ion implantation and irradiation-induced defects in Ge crystals," Materials Science in Semiconductor Processing, ScienceDirect, 2006, pp. 589-596, Elsevier Ltd.

Elbrecht, L., et al., "Integration of Bulk Acoustic Wave Filters: Concepts and Trends," IEEE MTT-S Digest, 2004, pp. 395-398.

Falster, R., "Orthogonal Defect Solutions for Silicon Wafers: MDZ and Micro-defect Free Crystal Growth," Process Gases, Chemicals and Materials, Feb. 2, 2002, 240-245, Issue 12, Future FAB International.

Job, R., et al., "Oxygen Gettering on Buried Layers at Post-Implantation Annealing of Hydrogen Implanted Czochralski Silicon,"
TuDelft, Diffusion and Defect Data, XP008047987, Jan. 1, 1997, pp. 91-96, vol. 57-58.

Karoui, A., et al., "Role of Nitrogen Related Complexes in the Formation of Defects in Silicon," Applied Physics Letters, American Institute of Physics, Mar. 25, 2002, pp. 2114-2116, vol. 80, No. 12.

Ogura, A., "Formation of Buried Oxide Layer in Si Substrates by Oxygen Precipitation at Implantation Damage of Light Ions," The Japan Society of Applied Physics, Oct. 15, 2001, 3 pages.

Ohguro, T., et al., "Improvement of High Resistivity Substrate for Future Mixed Analog-Digital Applications," Symposium on VLSI Technology Digest of Technical Papers, 2002, 2 pages.

Falster, R., et al., "On the Properties of the Intrinsic Point Defects in Silicon: A Perspective from Crystal Growth and Wafer Processing," Apr. 2000, pp. 219-244.

Plummer, J.D., et al., "Silicon VLSI Technology Fundamentals, Practice and Modeling," 2000, 7 pages, Prentice Hall.

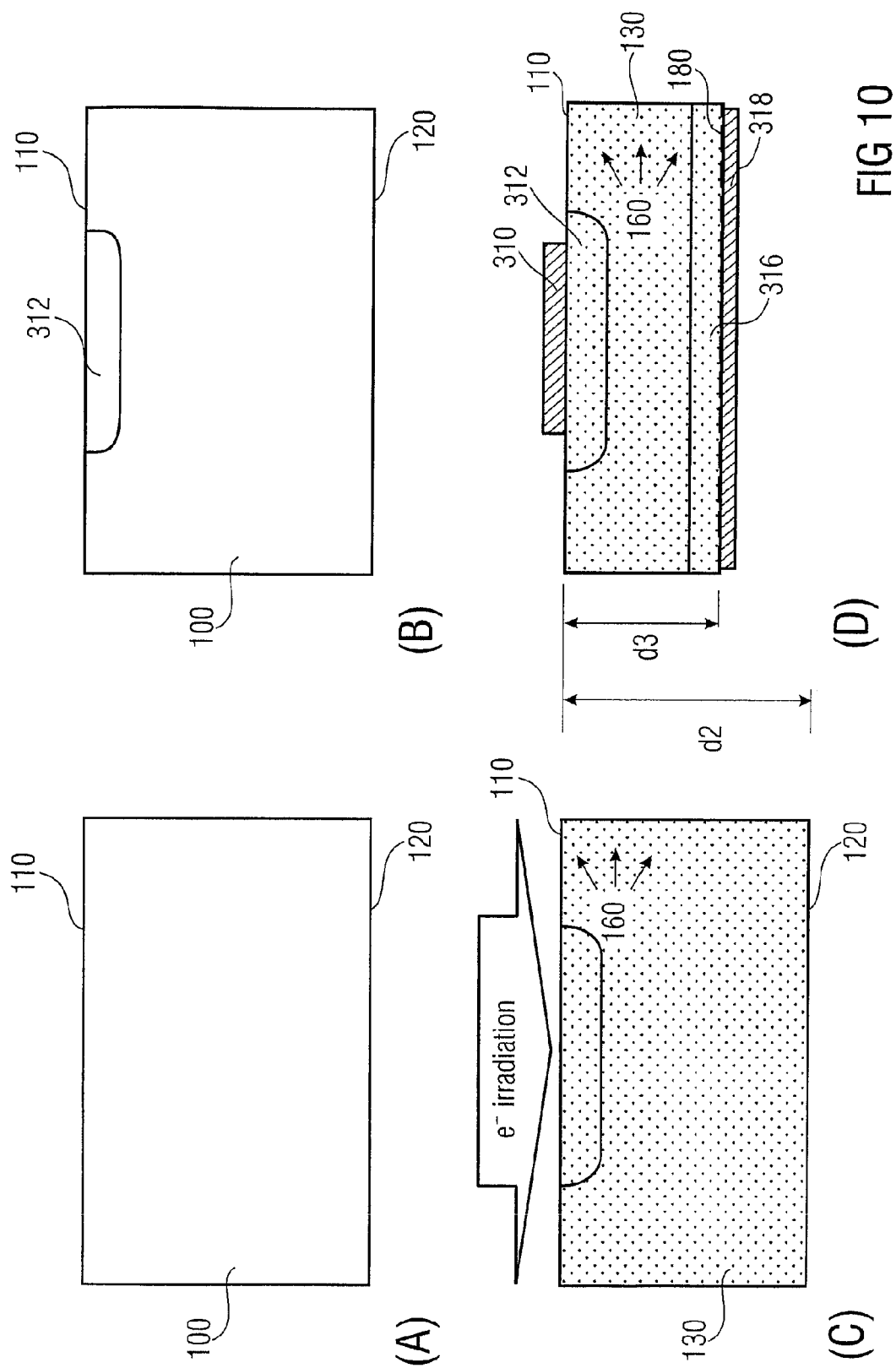

WAFER AND A METHOD FOR MANUFACTURING A WAFER

This application is a divisional of U.S. patent application Ser. No. 11/864,483, entitled "A Wafer and a Method for Manufacturing a Wafer," filed on Sep. 28, 2007 now U.S. Pat. No. 7,879,699, which application is hereby incorporated herein by reference.

TECHNICAL FIELD

An embodiment of the present invention relates to a wafer and to a method for manufacturing a wafer, and in particular to a method of avoiding thermal donors while processing devices on the wafer.

SUMMARY OF THE INVENTION

Embodiments comprise a wafer, the wafer comprising a wafer frontside with a predetermined surface structure, to form thereon or therein a device with a desired property, and a region with vacancy-oxygen complexes, which are adjacent to the wafer frontside.

BRIEF DESCRIPTION OF THE DRAWINGS

Embodiments of the present invention will be explained in greater detail in the following with reference to the accompanying drawings, in which:

FIGS. 10A to 10D show a process flow of manufacturing the diode device of FIG. 9 within the wafer.

Before explaining embodiments of the present invention in greater detail in the following on the basis of the drawings, it is pointed out that like elements in the figures are provided with the same or similar reference numerals, and that a repeated description of these elements is omitted.

DETAILED DESCRIPTION OF ILLUSTRATIVE EMBODIMENTS

Figure 1:
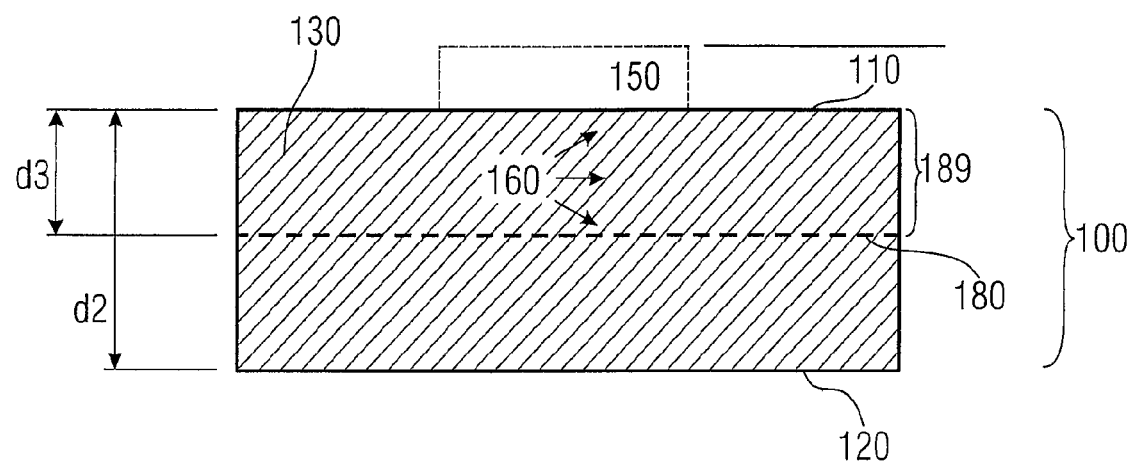
FIG. 1 shows a cross-sectional view of a wafer according to an embodiment of the present invention.

There are devices in which a substrate with very high-ohmic (specific) resistance (measured in $\Omega*cm$) is desirable, namely, in particular, to minimize current flow to a disc wafer or into the substrate. In particular, the high-frequency performance of passive devices is limited to a great extent by parasitic substrate influences, for example.

Today, technologies for the production or for the integration of passive high-frequency (RF) devices, such as coils, capacitors or also resonators, are available on the basis of modern semiconductor planar technology and are increasingly gaining importance. For achieving reasonable RF performance, insulating, semi-insulating or at least very high-ohmic substrates are desirable. For example, a glass carrier may be employed as an insulating substrate, and gallium arsenide (GaAs) is one example for semi-insulating substrates. Low-doped silicon wafers, on the other hand, are available as high-ohmic substrates, with typical resistivities of 200 $\Omega*cm$ or more. In order to achieve a resistivity of, about, 1000 $\Omega*cm$ or higher, n-type silicon wafers need a dopant density of around $4.2 \times 10^{12}$ $cm^{-3}$ or below, whereas p-type silicon wafers need a dopant density of around $1.3 \times 10^{13}$ $cm^{-3}$ or below. In addition, high-ohmic wafer substrates are needed for power semiconductors with high blocking/breakdown voltages, like diodes or insulated-gate bipolar transistors (IGBTs).

When using, for example, high-ohmic silicon substrates, a principle technical problem results, which consists of the fact that the doping may change depending on the respective fabrication process, and having a high resistivity (high-ohmic resistance) hence is not a stable (process-invariant) property of the wafers. For example, oxygen complexes, so-called thermal donors (TDs), may be created in significant concentrations. Interstitial oxygen, which is distributed between regular lattice positions, comprises the major source for the formation of silicon-oxygen complexes acting as thermal donors. For example, using (CZ) silicon material with an interstitial oxygen concentration of about $1 \times 10^{18}$ $cm^{-3}$, the maximum thermal donor concentration can reach $3 \times 10^{16}$ $cm^{-3}$ after annealing at about 450° C. If annealed at about 450° C. for one hour only, a TD concentration of ca. $2 \times 10^{15}$ $cm^{-3}$ has been reported.

It is obvious that thermal donors created in such concentrations will completely alter the resistivity of an initially low-doped silicon wafer, because the TDs become the dominant dopant. For low-doped n-type wafers, TDs always decrease the resistivity. For low-doped p-type wafers, sufficiently small TD concentrations will compensate or slightly over-compensate the initial p-type doping, resulting in an increased resistivity. For higher TD concentrations, however, TDs will decrease the resistivity below the original level. RF-device wafers thus processed may finally be on a low-ohmic (n-doped) silicon substrate (wafer) at the end of the process. As a consequence, the RF devices suffer from a substantial deterioration of their RF performance. Such performance losses may lead to violations of the chip or product specification and correspondingly to production yield losses. In case of diodes or IGBTs, the blocking capability can be reduced by the creation of thermal donors.

Previously, for the above-described applications in the 150 mm fabrication (6"), so-called float zone silicon wafers (FZ-wafers) have been used. Due to the production method, FZ-wafers only have a very low concentration of interstitial oxygen, whereby thermal donors cannot be formed in any significant concentration. As a consequence, high-ohmic low-doped p-type or n-type FZ-silicon material maintains its resistivity.

For the 200 mm fabrication (8"), however, FZ-wafers hardly are available. The available Czochralski wafer material (CZ-wafer), being pulled from melted silicon in a quartz crucible, comprises significantly higher concentrations of interstitial oxygen. Typical concentrations [Oi] of interstitial oxygen may range from about $3 \times 10^{17}$ to about $10^{18}$ $cm^{-3}$ or from about $5 \times 10^{17}$ to about $7 \times 10^{17}$ $cm^{-3}$. Such high interstitial oxygen concentrations, depending on the respective process for wafer production, may lead to significant generation of thermal donors, and correspondingly to a degraded or even insufficient performance of the resulting RF-devices. Corresponding effects are observed in various technologies.

Conventional approaches to prevent or to solve the described problem are:

(1) use of p-type CZ-wafers with higher dopant concentration (and thus smaller resistivity) by taking advantage of compensation effects, or (2) reduction of the thermal budget (length and intensity of a thermal treatment) while avoiding, if possible, the especially critical process temperatures around 450° C., or (3) use of additional tempering steps at higher temperatures, e.g., RTA (rapid thermal annealing) around 900° C.—for the (partial) annihilation of thermal donors already generated, or also (4) falling back on FZ-wafer material.

Disadvantages of the conventional solution approaches or methods described above can be summarized as follows:

With reference to approach 1, both the substrate doping and the ohmic property in connection therewith and the concentration of the thermal donors generated are subject to strong fluctuations. In particular, the formation rate of the thermal donors sensitively depends on influencing factors, such as the interstitial oxygen concentration, or the concentration of hydrogen or carbon, etc. Thus, there is the risk of insufficient or also overdosed compensation of an initial p-type (boron-doped) substrate. In both cases, a substrate that is too low-ohmic (either still p-type or n-type) will be generated. The corresponding process window is very small and may not even be present in the case of strong formation of thermal donors.

With reference to approach 2, the thermal budgets of the individual processes used can be modified only within certain limits, because the process temperatures influence a great number of process, layer and device properties. Moreover, the temperature influence is also subject to other factors, such as, for example, the present interstitial oxygen concentration.

With reference to approach 3, destruction of thermal donors needs high-temperature annealing. Such an annealing can, however, not take place at the end of the process, because certain materials (as, for example, metals like aluminum) can only cope with moderate temperatures up to about 400° C. Thereby, the destruction of thermal donors should be performed somewhere in the middle of the production process, more precisely prior to the so-called back-end-of-line (BEOL) processing steps, and thus is necessarily incomplete, as new thermal donors (TD) may be created afterwards.

With reference to approach 4, FZ-grown silicon wafers with 200 mm diameter are hardly available at present and are much more expensive than standard CZ-grown 200 mm silicon wafers.

Avoiding thermal donors is hence an important criterion when producing semiconductor devices, in particular when depletion characteristics of the semiconductor devices rely on a low-doped substrate material (a low-doped base or channel or drift zone).

Embodiments of the present invention provide a wafer comprising a device surface (wafer frontside) with a predetermined surface structure, to form thereon or therein a device with a desired property, and a bulk region with vacancy-oxygen complexes, e.g., $VO_2$ complexes, which are adjacent to the wafer frontside.

Here, vacancies refer to sites (point-like defects) in a crystal lattice, which are usually occupied by an atom in the crystal lattice arrangement, but which are unoccupied (the sites are "vacant"). On the other hand, self-interstitials are atoms, which are not at a regular lattice position, but instead occupy space in-between regular lattice sites. Other atoms (not the crystal atoms) can often occupy the "vacant site" in the lattice. In the case of oxygen, the vacancy becomes a vacancy-oxygen complex. There are also higher order vacancies, namely if more than one regular atom in the lattice is missing. If they are occupied by more than one oxygen atom, a higher order vacancy-oxygen complex, denoted by $V_mO_n$, is formed, where m counts the number of vacant sites and n the number of oxygen atoms occupying the vacant site.

Embodiments perform an electron irradiation at first, so that numerous vacancies form in the wafer crystal lattice, which may, for example, comprise silicon. A large number of these vacancies recombine with the silicon self-interstitials also produced, wherein the silicon self-interstitials refers to silicon atoms outside the crystal lattice arrangement. Together with interstitial oxygen, other vacancies form the vacancy-oxygen complexes, like exemplarily the so-called VO complexes ("A centers") or $VO_2$ complexes, especially at annealing temperatures exceeding about 400° C.

Further embodiments describe a way of obtaining a high-ohmic substrate material while avoiding thermal donors by, for example, specifically produced oxygen complexes in CZ wafer material by means of proton irradiation (proton implantation). The proton irradiation-induced vacancy-oxygen complexes result namely in a consumption of oxygen atoms and vacancies, which are both important for the formation of thermal donors. For this, however, CZ wafers of an oxygen concentration of more than about $6.5 \times 10^{17}\,\text{cm}^{-3}$ are desirable here.

Even more effective embodiments are using specific CZ wafers which already have a lower oxygen concentration in the initial state. This is, for example, the case in magnetically-grown CZ wafer material, denoted also as MCZ wafer material. For magnetically-grown CZ wafers, the interstitial oxygen concentration [Oi] in the wafer (exemplarily silicon slice) is kept small by applying an external magnetic field during crystal growing, namely typically below about $3 \times 10^{17}$ oxygen atoms per $\text{cm}^3$. In this case, no (or only very few) oxygen precipitates can be generated. Instead, it is proposed to generate vacancy-oxygen complexes (e.g., $VO_2$ centers), which do not act as donors, in a sufficient density as a method to reduce the interstitial oxygen concentration $[O_i]$ and to thus keep the substrate in a high-ohmic state during the entire device processing flow.

In preferred embodiments, a high vacancy density is generated by means of an electron radiation into the starting material slice (wafer or substrate) at the very beginning of the device processing. The high vacancy density supports in turn the formation of $VO_2$ centers and hence reduce the interstitial oxygen concentration [Oi].

In further embodiments the entire slice volume remaining after a thinning process or at least a large part thereof is provided with a high vacancy density in order to achieve the desired effect (high-ohmic substrate) for the finished device. This can easily be achieved with electron irradiation. Additional embodiments stack several slices (wafers or substrates) above one another and when irradiating with sufficient energy vacancies in a plurality of slices can be generated in one step, thereby considerably reducing the cost. Typical electron concentrations here are in a range between about $10^{11}$ and about $10^{15}$ per $\text{cm}^2$ or ranging from about $10^{12}$ to about $10^{14}$ electrons per $\text{cm}^2$ and typical irradiation energies may be in a range between about 1 and about 50 MeV or ranging from about 5 to about 20 MeV.

In yet another embodiment, $VO_2$ centers are produced in a low-oxygen CZ material by means of proton irradiation from the slice front (wafer frontside). The slice front here refers to that side of the wafer where the device can be formed or arranged in the subsequent processes. Since typical thicknesses of the finished devices described above are in the range between 100 µm and 300 µm or at around 150 µm, energy of around 4 MeV, for example, is suitable here. Typical proton doses suitable for achieving the desired effect are, for example, in a range between about $10^{13}$ to about $10^{15}$ protons per $cm^2$ and in another range of some $10^{13}$ to some $10^{14}$ protons per $cm^2$.

Embodiments use additional annealing steps which may, for example, be performed at around 350° C. or more, in order to transform the VO complexes into $VO_2$ or even higher vacancy-oxygen complexes, like, for example, $VO_3$, $VO_4$ etc. which do not act as donors. Thus, more interstitial oxygen can be bound in such complexes. More generally, higher complexes, like, for example, $V_mO_n$ complexes, may also be formed, m indicating the number of vacancies at a position of the crystal lattice and n indicating the number of oxygen atoms attached there.

The annealing step to form $VO_2$ complexes can be performed, for example, as a typical high-temperature process in the following way. At first, annealing over several hours (exemplarily between 4 and 6 hours or roughly 5 hours) can be performed at temperatures ranging between about 400° C. and about 1050° C. or between about 500° C. and about 850° C. in order to form $VO_2$ centers. This annealing can be performed, e.g., in an inert atmosphere (for example, comprising nitrogen or a noble gas).

Since the $VO_2$ centers are thermally stable up to temperatures above about 1000° C. the irradiation can take place at the beginning of processing (e.g., of a RF device). Irradiating and annealing, however, may in other embodiments, for example, in the case of diode or IGBT fabrication, also be performed later on in the process flow, exemplarily before forming the metallization.

In summary, embodiments of the present invention provide a high-ohmic wafer, which is achieved by forming, for example, $VO_2$ centers in a high-resistance starting material (wafer material), preferably by means of high-energy electron irradiation. The consequence of this is that the interstitial oxygen concentration [Oi] is reduced and thus an alteration of the bulk resistivity as a consequence of the generation of so-called thermal donors in the course of device processing can be avoided. Beyond generating $VO_2$ centers, higher vacancy-oxygen complexes, such as, for example, $V_mO_n$, which do not act as donors, can exemplarily be produced by means of electron irradiation and subsequent annealing. In addition, an alternative to electron irradiation is to perform a proton irradiation.

Embodiments of the present invention, and particularly the high density of vacancy-oxygen centers, entail several advantages, with respect to the above-mentioned conventional devices. As a first advantage, the charge carriers have a significantly lower mean free path and thus are subject to significantly increased substrate resistance. In comparison with conventional substrates, moreover, temperature dependence of the resistivity decreases significantly.

It is also possible to increase the blocking capability (depletion property) of power semiconductors since in this case the avalanche multiplication will only set in at higher electrical field strengths.

Vacancy-oxygen complexes and especially $VO_2$ centers are of an advantage in that they do not exhibit (thermal) doping effects and stay electrically inactive. The $VO_2$ centers are capable of binding a maximum number of interstitial oxygen atoms, and by the binding of these oxygen atoms to the non-doping $VO_2$ complexes they can no longer contribute to forming thermal donors. The concentration [Oi] of the interstitial oxygen is thus reduced considerably by generating $VO_2$ centers, a great proportion of the interstitial oxygen atoms have been used up in the generated vacancy-oxygen complexes. In addition, thermal donors are prevented from forming or, at least, suppressed greatly, because their formation rate is highly dependent on the interstitial oxygen concentration [Oi].

Finally, it is advantageous that reflections of phonons at the wafer backside (opposite to the formed RF device on the wafer front side) can be reduced or avoided by pronounced scatterings of phonons at the oxygen complexes.

FIG. 1 shows a cross-sectional view through a wafer 100, which comprises a device surface (wafer frontside) 110 and a further surface (wafer backside) 120, wherein a region (high-vacancy-density region) 130 is arranged along the device surface 110 and the high-vacancy-density region 130 extends across the wafer 100 with a wafer layer thickness d2. The wafer surface 110 is formed so that a device 150 can be arranged on the wafer surface 110 in a following processing. The wafer surface 110 may, for example, additionally be smoothened or polished, so that it comprises a highly planar surface, whereas the further surface 120 may not be treated during the process of manufacturing the wafer 100. In this sense, the wafer surface 110 designates the front side and the further surface 120 the backside of the wafer 100. Hence, the wafer surface 110 is the surface, on which the device 150 is formed and not the surface of the device 150. According to embodiments, the high-vacancy-density region 130 induces vacancy-oxygen complexes 160 (especially vacancy-oxygen complexes $VO_2$ or higher-order vacancy-oxygen complexes $V_mO_n$ with m>1 or n>2) during an annealing step.

The wafer 100 can be thinned after (or before) a processing of the device 150 to obtain a final wafer 189 with a thickness d3 (a new wafer back side surface indicated by a dashed line 180 in FIG. 1), so that the substrate for the device 150 is formed by the high-vacancy-density region 130 or by parts of the high-vacancy-density region 130.

The high-vacancy-density region 130 in FIG. 1 may be generated by electron irradiation with predetermined energy. In this case, the energy is chosen preferably in such a way that the entire wafer substrate in irradiated (penetrated) by the electrons. Therefore, using electron irradiation, the penetration depth equals or, preferably, exceeds the wafer thickness d2.

Concerning the dose for the electron irradiation, an exemplary value may be chosen to be within the range from about $10^{12}$ to about $10^{14}$ electrons per $cm^2$. The dose of the electron irradiation may, for example, be adapted to a concentration of the interstitial oxygen in the substrate crystal—e.g., the more interstitial oxygen present, the higher the electron concentration may be chosen. For the target application bulk acoustic wave resonators or filters, in which the substrate 100 acts mainly as (mechanical) support of the device 150, the change in the crystal structure (additional vacancies or voids) due to the irradiation is not disadvantageous. This is because the vacancy-oxygen complexes change acoustic properties of the wafer 100 in a desirable way, namely by suppressing of unwanted reflections of acoustic waves, for example.

Figure 2:
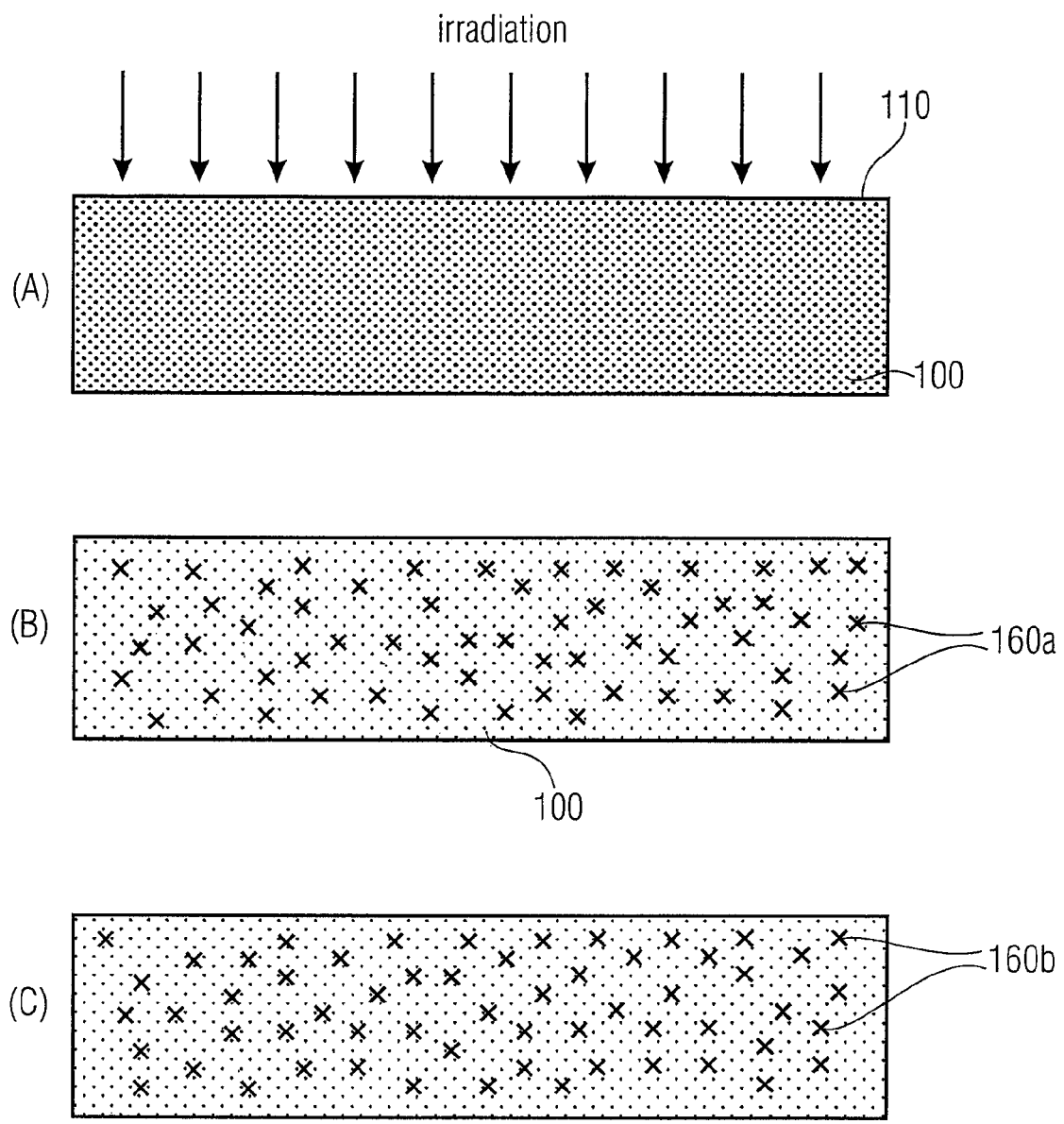
FIGS. 2A to 2C show cross-sectional views of the wafer referring to a sequence of steps of processing by electron irradiation.

FIGS. 2A to 2C show schematic cross-sectional views of an electron-irradiated and correspondingly annealed low-oxygen CZ sample in which a very high density of $VO_2$ centers has formed in the irradiated region of a low-oxygen material, wherein annealing takes place after electron irradiation.

FIG. 2A shows a wafer 100 (exemplarily a silicon substrate) comprising interstitial oxygen with a concentration [Oi]. The wafer 100 is subjected to irradiation from the side 110, wherein the irradiation may exemplarily include electron irradiation. The consequence of irradiation is that a high vacancy density is generated in the wafer 100, making a formation of $VO_2$ centers easier.

FIG. 2B shows how the vacancy oxygen centers 160a (VO) have formed as a consequence of the irradiation and, at the same time, the concentration of the interstitial oxygen [Oi] has decreased.

FIG. 2C shows how the vacancy-oxygen centers VO 160a in the wafer material have transformed to di-oxygen vacancy centers $VO_2$ 160b after annealing (temperature budget) and have, at the same time, resulted in further reduction in the interstitial oxygen concentration [Oi] in the wafer material.

Thereby, the oxygen-induced thermal donors can be avoided or at least significantly reduced, because a great proportion of the interstitial oxygen atoms have been used up in the generated vacancy-oxygen complexes.

Figure 3:
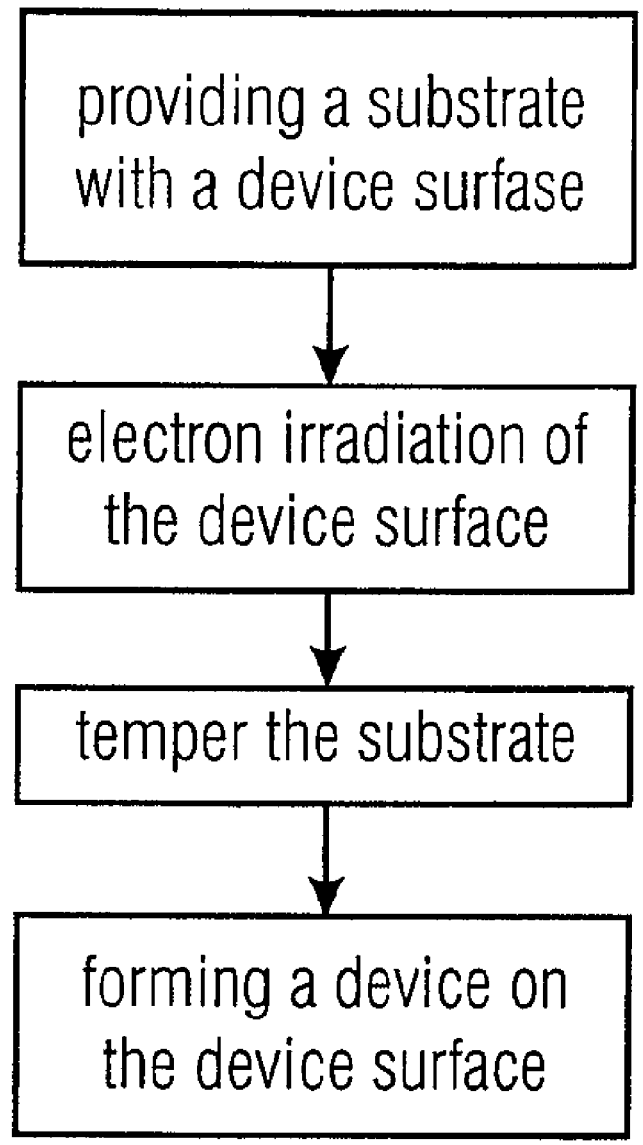
FIG. 3 shows a sequence of steps for producing the wafer according to another embodiment.

FIG. 3 shows a schematic step sequence for a method for producing the wafer 100. To this end, at first a substrate 100 with a device surface 110 is provided, and subsequently the surface is subjected to electron or proton irradiation. The irradiation of the substrate 100 is executed with the aim that vacancies form in the substrate 100. These vacancies are grown to vacancy-oxygen complexes 160 in the following annealing step, i.e., the interstitial oxygen attaches to the vacancies. The annealing step may, for example, comprise a temperature of about 400 to about 1050° C. or between about 500° C. and about 850° C. for a duration ranging, for example, between 2 and 10 hours.

Figure 8:
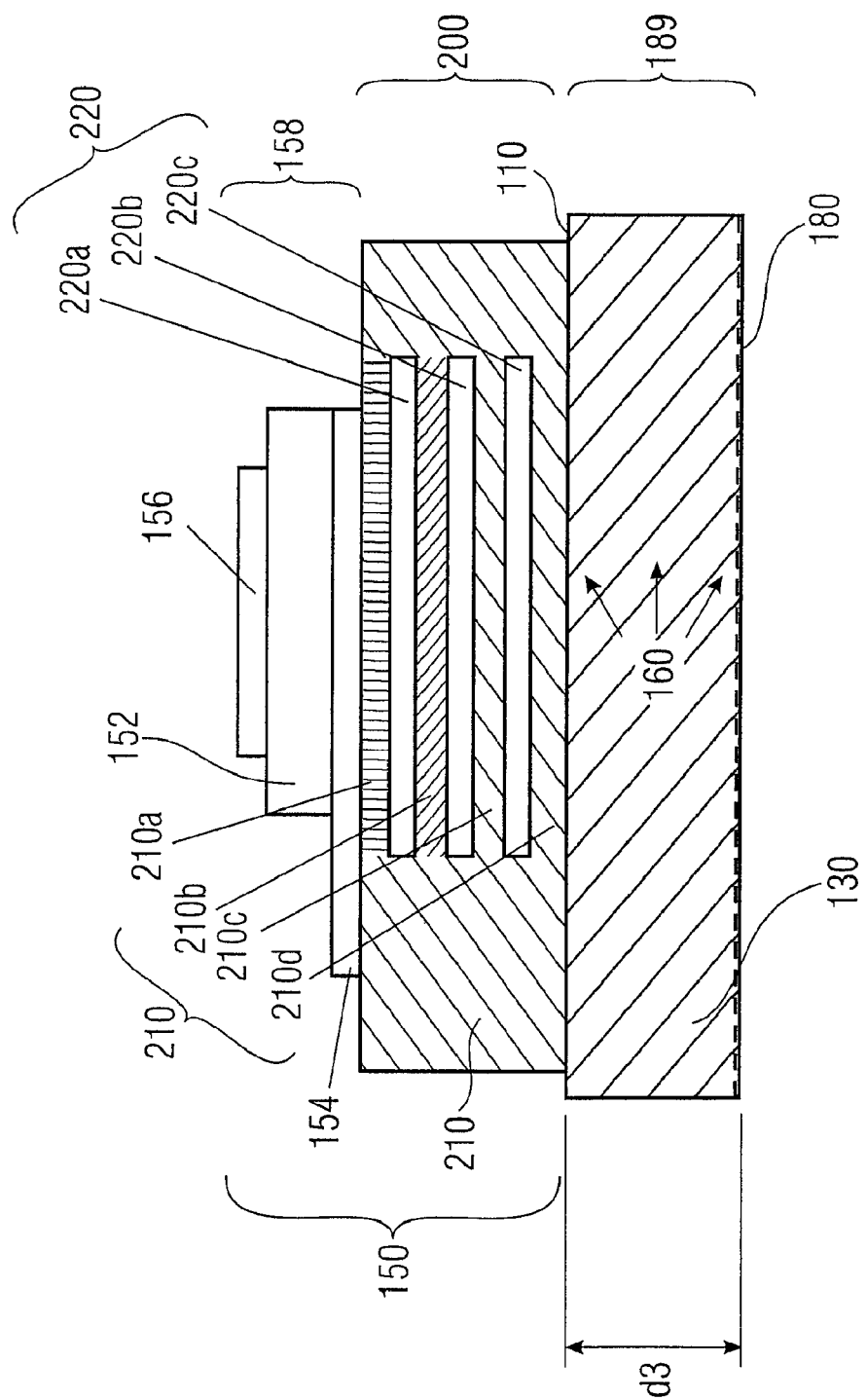
FIG. 8 shows a cross-sectional view of the wafer with a BAW device formed thereon.

Subsequently, the device 150 may be formed on the wafer surface 110, and the substrate 100 with the vacancy-oxygen complexes 160 thus serves as a high-ohmic carrier with a low interstitial oxygen concentration [Oi] particularly suited for RF devices. Optionally, the layer sequence may be expanded in that, prior to forming the device 150, a planarization or polishing step is performed on the wafer surface 110, so that a highly planar surface 110 forms, which may, for example, be a basis for a bottom electrode 154 or an acoustic mirror 200 of a BAW device 150 (FIG. 8).

FIGS. 4A-4D show a typical process flow for manufacturing a device 150 on a high-ohmic substrate built from the high vacancy density region 130.

Figure 4A:
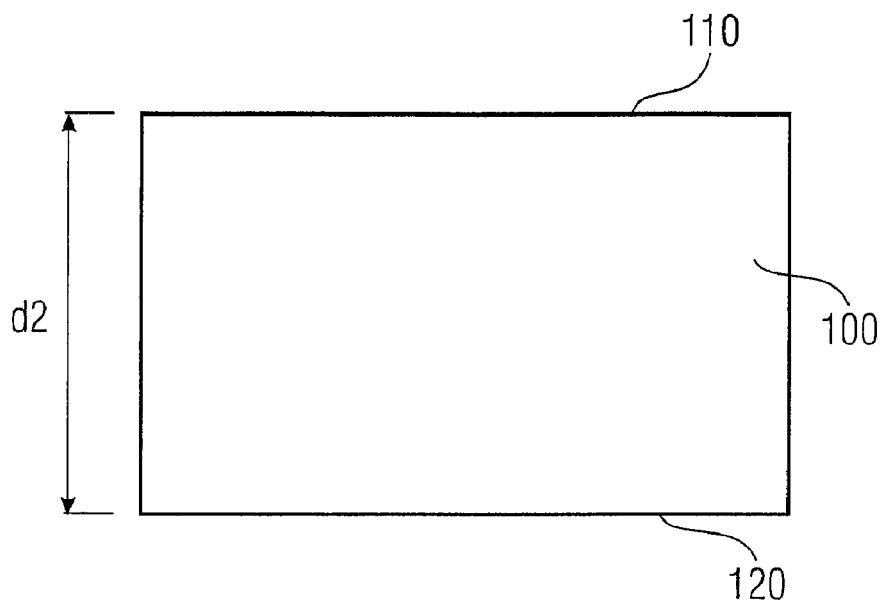
FIGS. 4A to 4D show a typical process flow for processing the wafer with a device.

FIG. 4A shows the original wafer substrate 100 with the wafer front side 110 and the wafer back side 120, comprising the wafer layer thickness d2.

Figure 4B:
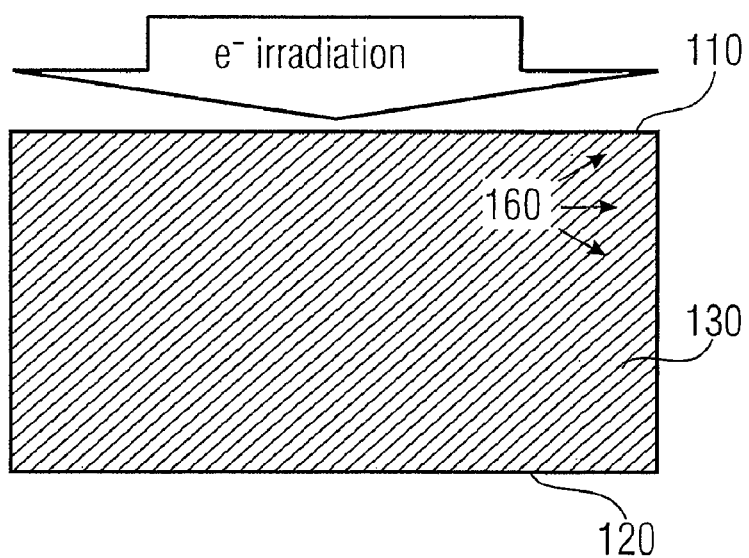

FIG. 4B shows the wafer 100 after electron irradiation (e-irradiation) of the wafer front side 110 and the annealing to form vacancy-oxygen (preferably $VO_2$) complexes 160 in the high vacancy density region 130, which extends to the wafer back side 120.

Figure 4C:
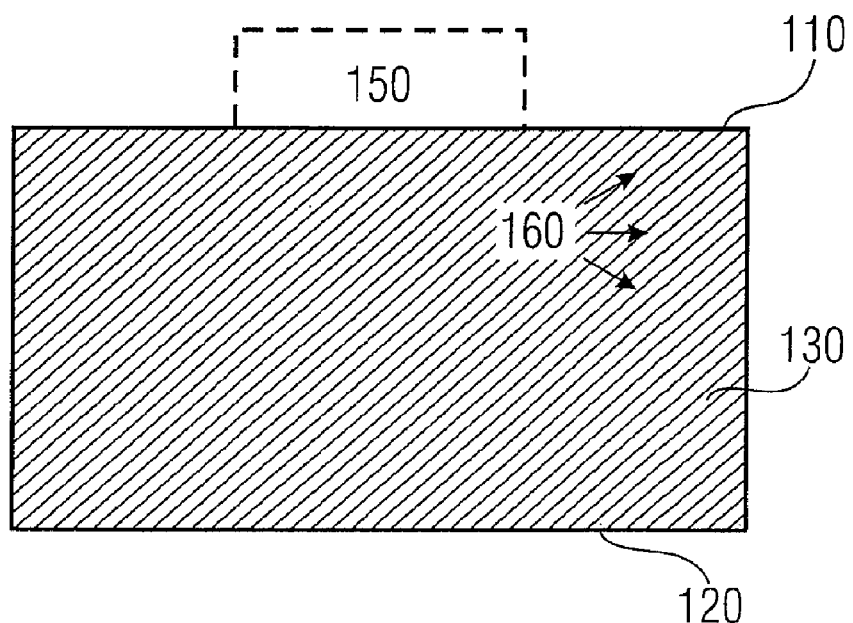

FIG. 4C shows as the next step, the processing of the device 150 on the wafer front side 110, so that the high vacancy density region 130 with the exemplary vacancy-oxygen complexes 160 serves as the substrate for the device 150.

Figure 4D:
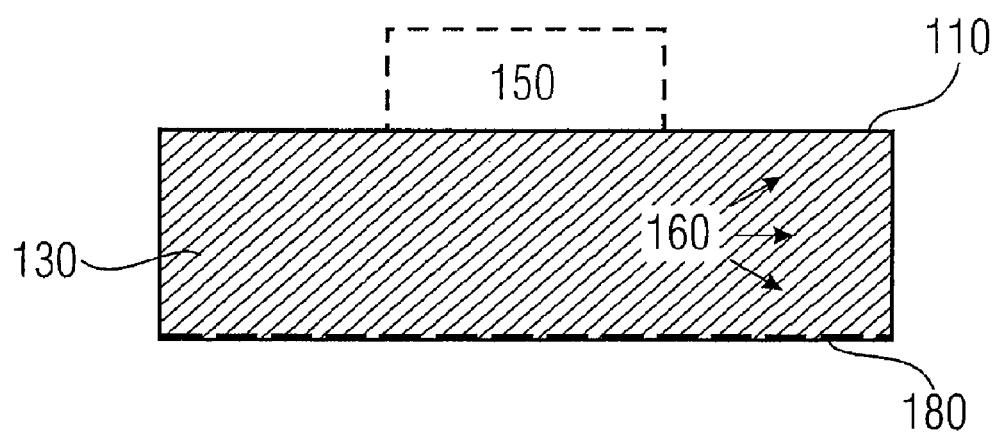

FIG. 4D shows as optional last step, a thinning at the end of processing to the backside surface 180 (see FIG. 1) at the end of the process, which comprise a final wafer thickness d3. The thinning can, for example, be performed by a back side grinding and/or etching step.

Figure 5:
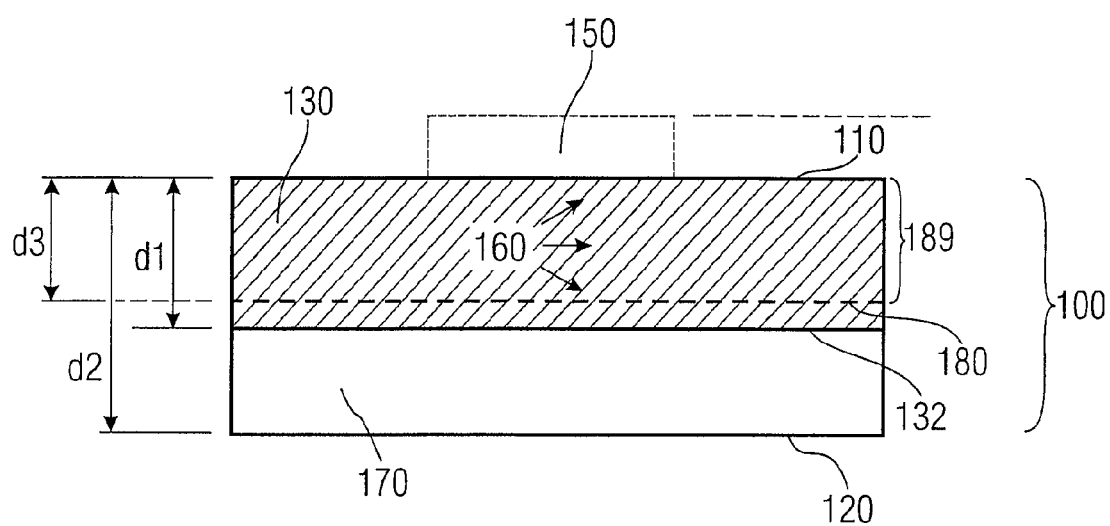
FIG. 5 shows a cross-sectional view of a further wafer according to a further embodiment of the present invention.

FIG. 5 shows an embodiment, where the high-vacancy-density region 130 comprises vacancy-oxygen complexes 160, but in contrast to the embodiment as shown FIG. 1 the high-vacancy-density region 130 comprises a mean layer thickness d1. The wafer layer thickness d2 differs now from the mean layer thickness d1 of the high-vacancy-density region 130, so that the wafer 100 comprises a low-vacancy-density region 170, which is arranged between the further surface 120 of the wafer 100 and the high-vacancy-density region 130. An interface 132 may separate the high- and low-vacancy-density regions 130, 170. The low-vacancy density region 170 may, for example, be removed or thinned again after a processing of the device 150 to obtain a final wafer 189 with a thickness d3 (indicated by a dashed line 180 in FIG. 1), so that the substrate for the device 150 is formed by the high-vacancy-density region 130 or by parts of the high-vacancy-density region 130.

The high-vacancy-density region 130 may, for example, be generated by proton irradiation with predetermined energy, wherein the predetermined energy is chosen so as to achieve a desired value for the mean layer thickness d1. Hence, the high-vacancy-density region 130 is arranged along the wafer surface 110 with a mean thickness d1 corresponding to the end-of-range of an exemplary proton irradiation. The desired value for the mean layer thickness d1 may, for example, be chosen corresponding to a desired layer thickness of the substrate 100 for the finished device 150. The mean layer thickness d1 may, for example, comprise more than about 30%, at least about 60% or at least about 90% of the wafer layer thickness d2 (i.e., d1<d2 or d1<<d2). It is also possible that the mean layer thickness d1 matches the wafer layer thickness d2. This is the case if the energy of the proton radiation is chosen such that the penetration depth of the protons corresponds roughly to the wafer thickness d2 so that vacancy-oxygen complexes 160 form across the entire wafer thickness d2. This may further be achieved by options like using a sufficiently thin starting wafer, or using some sufficiently large mean layer thickness of the region, or by removing sufficient material from the backside of the wafer during a thinning process.

In further embodiments the final wafer thickness or final layer thickness d3 is bigger than the mean layer thickness d1, which is especially possible, if the low-vacancy-density region 170 comprises a specific resistance (after the thermal annealing), which is high enough to ensure a proper operation of the device 150 with desired specifications, e.g., if the specific resistance comprises at least a value of about 100 Ω*cm.

Figure 6:
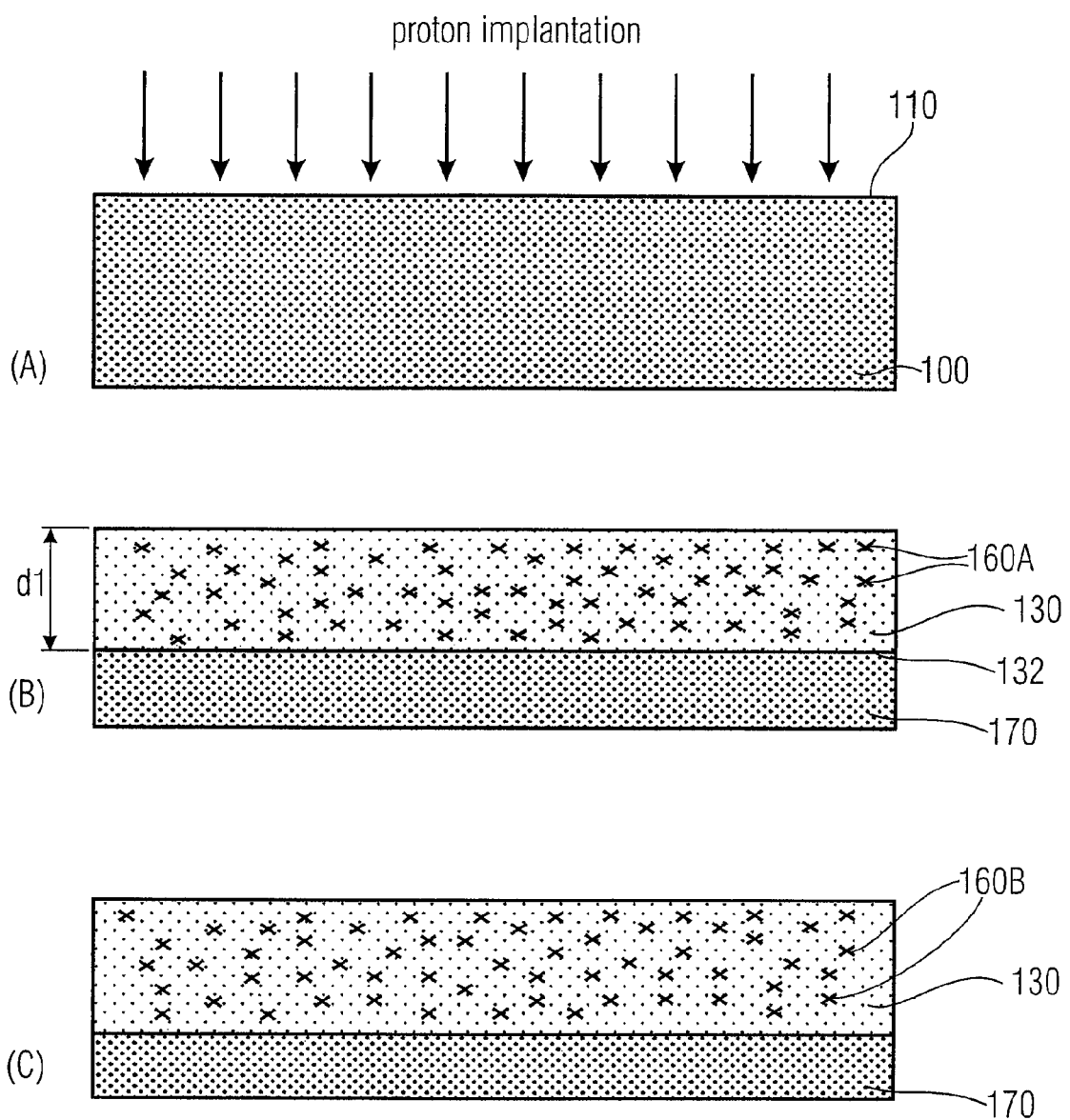
FIGS. 6A to 6C show cross-sectional views of the further wafer referring to a sequence of steps of processing by proton implantation.

FIGS. 6A to 6C show schematic cross-sectional views of a proton irradiated (H+ implantation) and correspondingly annealed low-oxygen CZ sample in which a very high density of $VO_2$ centers has formed in the irradiated region of a low-oxygen material, wherein annealing takes place after irradiation.

FIG. 6A shows a wafer 100 (exemplarily a silicon substrate) comprising interstitial oxygen with a concentration [Oi]. The wafer 100 is subjected to irradiation from the side 110, wherein the irradiation may exemplarily comprise the proton implantation. The consequence of irradiation is that a high vacancy density region 130 is generated in the wafer 100 from the device surface 110 up to a depth d1, making a formation of $VO_2$ centers easier. A remaining part of the wafer 100 comprises the low-vacancy-density region 170, which contacts the high vacancy density region 130 along the interface 132.

FIG. 6B shows how the vacancy oxygen centers 160a (VO) have formed in the region 130 as a consequence of the irradiation and, at the same time, the concentration of the interstitial oxygen [Oi] has decreased.

FIG. 6C shows how the vacancy-oxygen centers VO 160a in the wafer material have transformed to di-oxygen vacancy centers $VO_2$ 160b after annealing (temperature budget) and have, at the same time, resulted in further reduction in the interstitial oxygen concentration [Oi] in the wafer material.

As before, the oxygen-induced thermal donors can be avoided or at least significantly reduced, because a great proportion of the interstitial oxygen atoms have been used up in the generated vacancy-oxygen complexes.

FIGS. 7A-7D show a typical process flow for manufacturing a device 150 on a high-ohmic substrate built from the high vacancy density region 130.

Figure 7A:
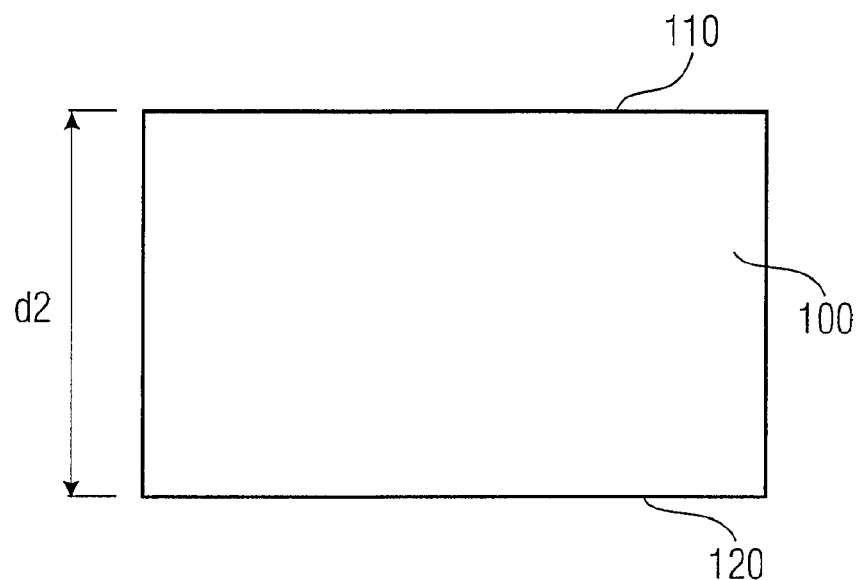
FIGS. 7A to 7D show a typical process flow for processing the further wafer with the device.

FIG. 7A shows the original wafer substrate 100 with the wafer front side 110 and the wafer back side 120, comprising the wafer layer thickness d2.

Figure 7B:
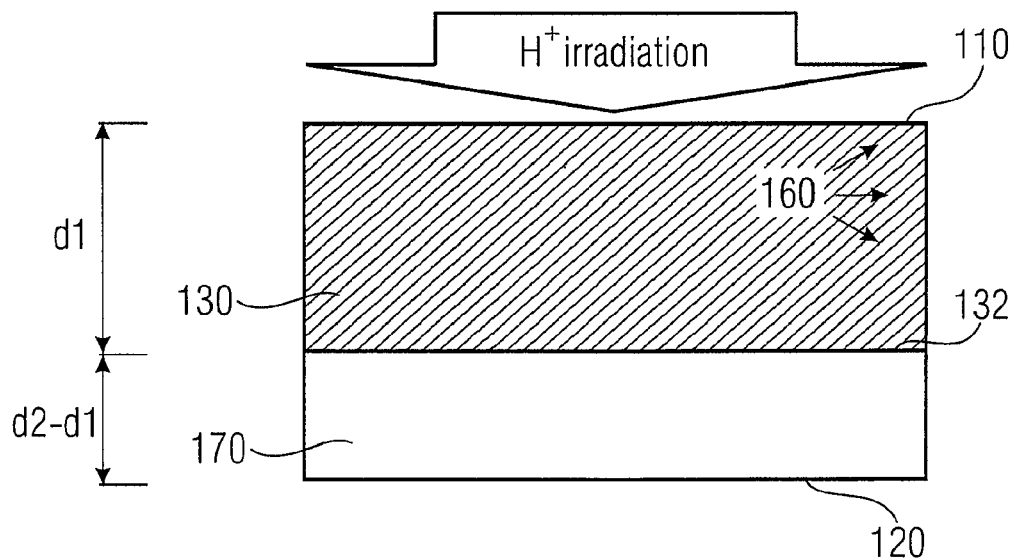

FIG. 7B shows the wafer 100 after proton irradiation (H+-irradiation) of the wafer front side 110 and the annealing to form vacancy-oxygen (preferably $VO_2$) complexes 160 in the high vacancy density region 130, which comprises the mean layer thickness d1. The high vacancy density region 130 is separated from the low vacancy density region 170 by the interface 132. The low vacancy region 170 extends to the wafer back side 120 and comprises a mean layer thickness of d2-d1.

Figure 7C:
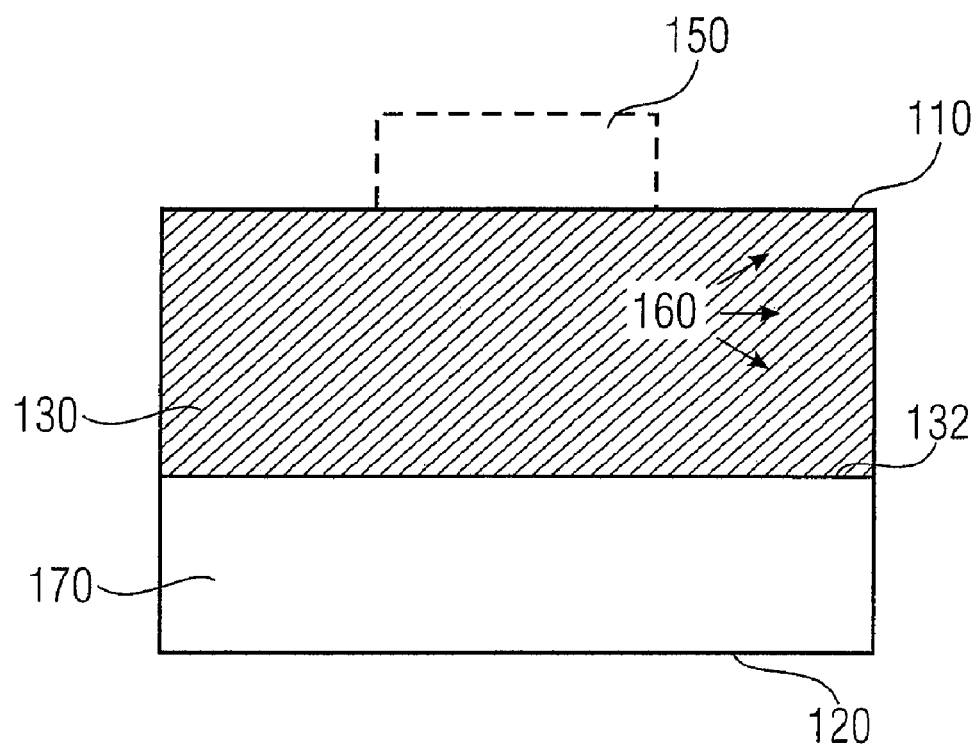

FIG. 7C shows as the next step, the processing of the device 150 on the wafer front side 110, so that the high vacancy density region 130 with the exemplary vacancy-oxygen complexes 160 serves as the substrate for the device 150.

Figure 7D:
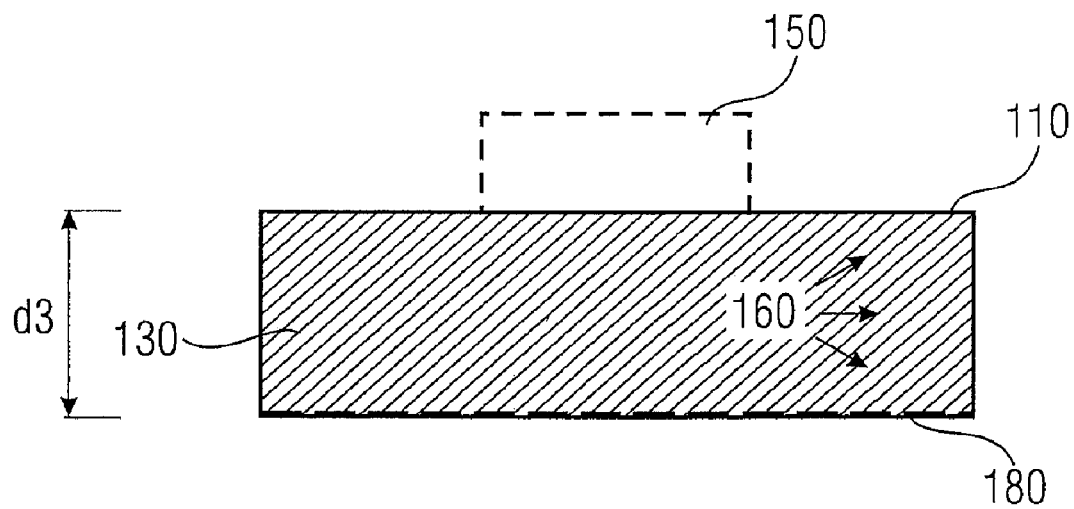

FIG. 7D shows as the last step, a thinning at the end of processing to the backside surface 180 (see FIG. 1) at the end of the process, which comprise a final wafer thickness d3. The thinning can, for example, be performed by a back side grinding and/or etching step and the final wafer thickness d3 at the end of processing is preferably smaller than the mean layer thickness d1 of the high vacancy density region 130 (or is of approximately the same value as d1 or +/−30% of it). Therefore, in preferred embodiments the thicknesses can fulfill the relations: 0<d1<d2 and 0<d3<d2, wherein d3<d1 (e.g., d3 can be at least 50% or at least 90% of d1), or d3 is at least approximately equal to d1.

Note that d1 equals d2 for electron irradiation (see FIGS. 4A-4D), whereas for proton irradiation, d1 is correlated to the energy-dependent end-of-range.

In case of proton irradiation (H+ implantation), the mean thickness d1 of the high-vacancy-density region 130 can, for example, comprise approximately about 300 μm and the wafer thickness d2 approximately about 700 μm or about 725 μm (for example, for a typical 200 mm wafer). The final wafer thickness d3 (after the thinning to the dashed line 180) can, for example, comprise a value between about 100 μm and about 200 μm or of approximately about 150 μm. These values for d1, d2 and d3 can of course differ in other embodiments and can depend especially on the desired specification for the device 150 and/or the mechanical stability of the substrate in conjunction with a desired specific resistivity. Also the device 150 can be any other device (e.g., other RF-devices like coils or capacitors), for which a high-ohmic substrate is desirable, the BAW resonator 158 serves only as an example (FIG. 8). Other embodiments include active devices (see FIGS. 9 and 10 below), like, e.g., diodes or IGBTs, which rely in their function on certain intrinsic or very lightly-doped regions within the substrate.

FIG. 8 shows the final wafer 189 with the processed device 150, which utilizes the region 130 with the vacancy-oxygen (preferably $VO_2$) complexes 160 (the region 130 is also denoted as high-vacancy-density region) as a substrate thinned to the thickness d3 (or to the dashed line 180 in FIG. 1). The region 130 can be generated either by electron irradiation or proton implantation.

In the embodiment shown in FIG. 8, the device 150 comprises a BAW (bulk acoustic wave) resonator 158 without acoustic decoupling structure and an acoustic mirror 200 as an example for an acoustic decoupling structure. The BAW resonator 158 comprises a piezoelectric layer 152 sandwiched between a first electrode 154 (bottom electrode) and a second electrode 156 (top electrode). Between the first electrode 154 and the high-vacancy-density region 130, the acoustic mirror 200 is formed, wherein the acoustic mirror 200 comprises an alternating layer sequence of materials with high acoustic impedance 220 and low acoustic impedance 210. In the embodiment shown, the acoustic mirror 200 comprises three layers with high acoustic impedance, the layers 220a to 220c, each separated by one layer with low acoustic impedance 210. The layers with high acoustic impedance 220 may also be completely embedded into layers (or material) with low acoustic impedances 210a-210d.

The BAW resonator 158 shown in FIG. 8 as one embodiment finds application in so-called BAW filters, for example, which in turn are applied particularly in mobile cellular communications. The BAW resonators typically resonate at frequencies around 1 to 2 GHz and as high-frequency devices rely on low-loss (ideally loss-free), high-ohmic substrates. BAW resonators or BAW-filters typically are designed as passive devices and do not need pn-junctions. Correspondingly, the substrate only serves as a carrier, and a so-called "denuded zone" with highly pure silicon, into which a high-quality pn-junction may be formed, is not needed for this reason. In order to obtain a BAW resonator 158 with desired properties (e.g., frequency-dependent attenuation for an RF input signal) it is important that the device surface 110 comprises a predetermined surface structure (e.g., a polished or a planar surface).

The high-ohmic substrate according to embodiments may also serve as carrier/underground for other BAW devices or for other passive RF devices like capacitors or coils. The BAW resonator 158 as the simplest example, only comprises one bottom electrode (first electrode 154), the piezoelectric layer 152 and one top electrode (second electrode 156). The acoustic mirror 200 serves for acoustic decoupling of the vibrating BAW resonator 158 from the substrate 130 and, for example, provides for acoustic waves being prevented from propagation into the substrate. As mentioned above, the acoustic mirror 200 for this purpose typically comprises a sequence of layers with alternating high and low acoustic impedance (high Z and low Z), wherein the layer sequence may, for example, be designed as a λ/4 absorber by choosing the individual layer thicknesses correspondingly. An example for a material with high acoustic impedance is tungsten, and silicon oxide may be used as a material with low acoustic impedance.

The BAW resonator 158 may be arranged on a common substrate 130 together with other resonators. For avoiding parasitic losses, the substrate 130 should therefore be insulating, semi-insulating or very high-ohmic. Silicon substrates with a resistivity of at least about 500 Ω*cm are typical in these applications, but a resistivity ranging from about 2 kΩ*cm to about 4 kΩ*cm is better.

It is understood that the piezoelectric layer 152 can comprise one or more different layers, of which at least one exhibits piezoelectric activity. The other layers between the top and bottom electrode 156 and 154 can be non-piezo-active dielectric or other layers to achieve special performance effects like temperature coefficient compensation or to facilitate manufacturing like adhesion layers. In addition, the other layers are typically thin when compared to "real" piezoelectric layer. It is also understood that the bottom and top electrode layers 154 and 156 can comprise one or more different layers. For example, the top electrode 156 can include a passivation layer, and both electrodes 154 and 156 may be composed of several layers with different conductive materials each.

For the acoustic mirror 200 possible materials for layers with high acoustic impedance comprise, for example: W, Pt, Mo, Cr, Ta, TiW, TiN, Ir, WSi, Au, $Al_2O_3$, SiN, $Ta_2O_5$ and Zirkon-oxide, wherein the last four are dielectrical materials. Possible materials for the piezoelectric layers are, for example, AlN, ZnO, and PZT. Materials with lower acoustic impedance are, for example, aluminum and silicon dioxide.

Figure 9:
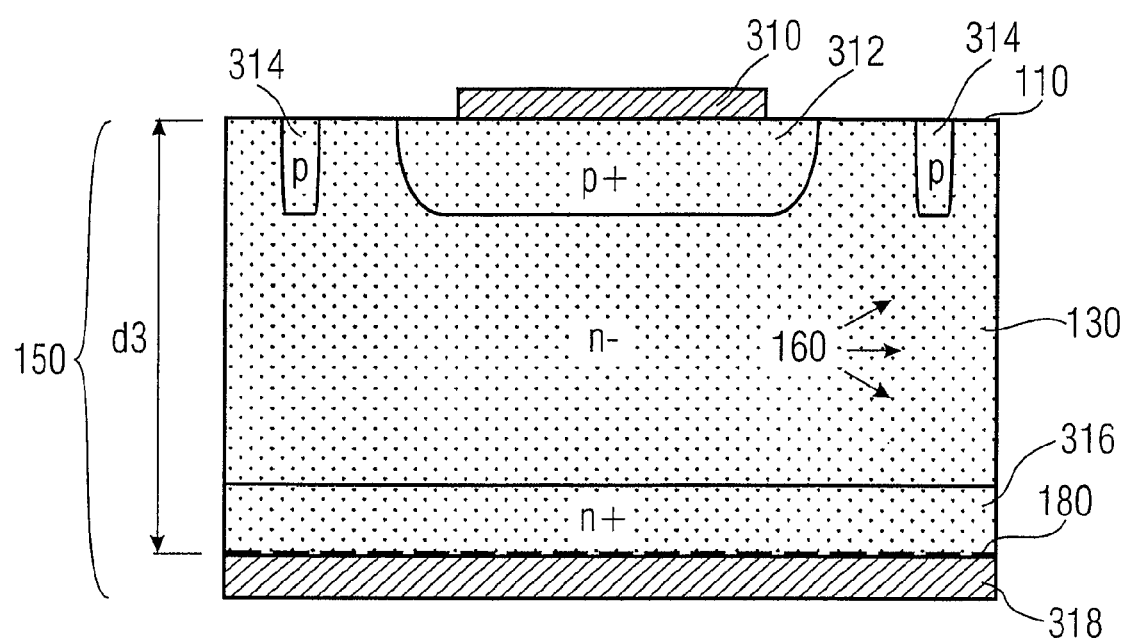
FIG. 9 shows a cross-section view of the wafer with a diode device formed therein.

FIG. 9 shows an embodiment, where the device 150 is not a passive device but instead comprises a diode or more specifically a PIN-diode, which is formed within the high-vacancy density region 130, which is generated, for example, by electron irradiation after an emitter 312/316 drive-in.

As substrate for the diode device 150 the high-vacancy density region 130 is used, which comprises a first diffused region 312 (e.g., a p+ implanted and annealed region) at the wafer frontside 110 and a second diffused region 316 (e.g., an n+ implanted and annealed region) at the wafer backside 180 (after thinning the wafer to the final wafer thickness d3). The high-vacancy density region 130, which comprises the vacancy-oxygen (preferably $VO_2$) complexes 160 is in this embodiment very lightly doped so that it comprises a high resistivity and forms the intrinsic zone (i region) of the PIN (or p-i-n) diode 150. The high-vacancy density region 130 can, for example, be n-doped. In order to contact the diode device 150, a top electrode 310 is formed on the wafer frontside 110 at the first diffused region 312. In addition, a backside contact 318 (n terminal) is formed at the wafer backside 180 in order to contact the second diffused region 316 (n+ implanted region). The top electrode 310 as well as the backside contact 318 can, for example, comprise a metallization and the top electrode 310 becomes the p-terminal and the backside contact 318 becomes the n-terminal.

The diode device 150 comprises moreover a guard ring 314, which in this embodiment is of p-type (the cross sectional view in FIG. 9 shows only two parts of it). The high resistivity of the intrinsic zone (i region) is ensured by the vacancy-oxygen (preferably $VO_2$) complexes 160, which especially ensure that the high resistivity is remained even after annealing processes or other temperature budgets. In this embodiment the high-vacancy density region 130, which serves as substrate for the diode device 150 comprises the final wafer thickness d3, which is obtained from the original wafer after a backside thinning process so that the original wafer layer thickness d2 is thinned to a thickness d3.

FIG. 10A-10D show a typically process flow for manufacturing the PIN-diode as an example. FIG. 10A shows the original wafer 100 with a wafer frontside 110 and a wafer backside 120. In a first step shown in FIG. 10B, the first diffused region 312 is formed at the wafer frontside 110. This can for example be achieved by a boron implantation so that a p+-emitter region emerges after an in-diffusion step.

As next step shown in FIG. 10C, the vacancy-oxygen complexes 160 are generated within the wafer by an electron irradiation from the wafer frontside 110. As result, vacancy-oxygen complexes 160 will be formed, for example, over the whole wafer thickness d2. Hence, the wafer comprises the high-vacancy density region 130, which extends from the wafer frontside 110 to the wafer backside 120.

FIG. 10D shows as the next step a thinning of the wafer thickness d2 to the final layer thickness d3 so that the wafer backside 120 is now formed along the line 180. After forming the diffused region 316, for example, by an n+-doping, the backside contact 318 is formed at the wafer backside 180 and, in addition, the top electrode 310 is formed on the wafer frontside 110 at the first diffused region 312. As a result, a thinned wafer 130 emerges with the top electrode 310 and the backside metallization 318.

The diode device as shown in FIG. 9 is only one example of an active device and other examples for active semiconductor devices comprise, besides diodes, insulated-gate bipolar transistors (IGBT) or thyristors. Whenever a substrate with the high resistivity is needed, which is especially stable under temperature processes, the wafer with the high vacancy density region 130 can be used as a substrate.

Embodiments also describe a wafer 100 with a device 150, where the thinning step is done at an intermediate state and not as a final process. The intermediate state can, for example, be moment in the processing, which before the step of forming the device 150 on the frontside 110 of the wafer. Another possibility is to perform the thinning after a first part of the device 150 has been processed, but before a last part is going to be processed. Also the step of irradiating and/or the step the annealing can be performed at a later stage of processing, e.g., after a first part of the device 150 is formed, but before forming the metallizations (to contact the device).

In further embodiments, the wafer 100 comprises instead of silicon another material, e.g., another semiconductor. Also the number and size of the vacancy-oxygen complexes can differ, dependent on the wafer material and on the manufacturing process. In addition, the amount of oxygen in the vacancies may differ, more than 50%, more than 80% or more than 90% of the total amount of oxygen being in the region 130 or in the wafer. The precipitates can comprise also other chemical elements, not only oxygen. It is moreover possible instead of protons to generate precipitates to use other isotopes of hydrogen (e.g., deuterium) or other particles or atoms.

Embodiments concern a bulk acoustic wave (BAW) device which comprises a first electrode formed on top of some acoustic-decoupling structure (e.g., an acoustic mirror) which is formed at least partially along the surface of the wafer, a piezoelectric layer formed at least partially on the first electrode, and a second electrode formed at least partially on the piezoelectric layer.

Embodiments may comprise in a further surface of the substrate an active semiconductor device (relying on p- or n-doped regions and pn-junctions). This active semiconductor device may be a diode. The diode may comprise a first doped region formed in the substrate at the surface, and a second doped region formed in the substrate at the further surface, and wherein the vacancy-oxygen region extends from the surface to the further surface.

Embodiments which stack a first substrate and a second substrate may also stack multiple substrates which may be irradiated at the same time to form the vacancies.

Embodiments concern a wafer, an apparatus and a method, wherein a region of the wafer adjacent to a wafer frontside comprises vacancy-oxygen complexes. The vacancy-oxygen complexes may comprise VO centers annealed at temperatures staring from about 350° C. The vacancy-oxygen complexes may comprise $VO_2$ centers or higher $V_mO_n$-centers.

What is claimed is:
1. An apparatus, comprising:
 a substrate comprising a surface and a region with vacancy-oxygen complexes adjacent to the surface; and
 a device formed on the surface or in the substrate wherein the substrate comprises a substrate thickness and the region with vacancy-oxygen complexes comprises a mean layer thickness, and wherein the mean layer thickness comprises at least 40% of the substrate thickness.

2. The apparatus of claim 1, wherein the device comprises a passive RF device.

3. The apparatus of claim 1, wherein the substrate comprises a further surface opposite to the surface, and wherein the device comprises an active semiconductor device.

4. The apparatus of claim 1, wherein a number and/or size of the vacancy-oxygen complexes are such that a specific resistivity of the region with vacancy-oxygen complexes maintains at least a value of 200Ω*cm during an annealing process at a temperature between 400° C. and 500° C.

5. The apparatus of claim 1, wherein the substrate comprises a substrate layer thickness and the region with vacancy-oxygen complexes comprises a mean layer thickness, and wherein the mean layer thickness comprises at least 90% of the substrate layer thickness.

6. The apparatus of claim 1, wherein the vacancy-oxygen complexes comprise di-oxygen-vacancy complexes VO2 or higher-order vacancy-oxygen complexes VmOn with m>1 or n>2.

7. The apparatus of claim 1, wherein the region with vacancy-oxygen complexes comprises a mean layer thickness within a range from 100 μm to 300 μM.

8. The apparatus of claim 1, wherein the vacancy-oxygen complexes are formed in a vacancy-rich region and the vacancy-rich region is formed by electron irradiation or by proton irradiation.

9. The apparatus of claim 1, wherein the region with vacancy-oxygen complexes comprises a specific resistivity of at least 200Ω*cm.

10. A wafer, comprising:
a wafer frontside with a predetermined surface structure, to form thereon or below a device with a desired property; and
a region with vacancy-oxygen complexes, the region adjacent to the wafer frontside wherein the wafer comprises a wafer thickness and the region with vacancy-oxygen complexes comprises a mean layer thickness, and wherein the mean layer thickness comprises at least 40% of the wafer thickness.

11. The wafer of claim 10, wherein the vacancy-oxygen complexes comprise di-oxygen-vacancy complexes VO2 or higher-order vacancy-oxygen complexes VmOn with m>1 or n>2.

12. The wafer of claim 10, wherein the vacancy-oxygen complexes are formed in a vacancy-rich region and the vacancy-rich region is formed by electron irradiation or by proton irradiation.

13. The wafer of claim 10, wherein the wafer comprises a wafer thickness and the region with vacancy oxygen complexes comprises a mean layer thickness and the mean thickness comprises at least 90% of the wafer thickness.

14. The wafer of claim 10, wherein the region with vacancy-oxygen complexes comprises a mean layer thickness within a range from 100 μm to 300 μm.

15. The wafer of claim 10, wherein the region with vacancy-oxygen complexes comprises a specific resistivity of at least 200Ω*cm.

16. The wafer of claim 10, wherein the device comprises a passive RF device.

17. The wafer of claim 10, wherein the wafer comprises a further surface opposite to the predetermined surface structure, and wherein the device comprises an active semiconductor device.

18. The wafer of claim 10, wherein a number and/or size of the vacancy-oxygen complexes are such that a specific resistivity of the region with vacancy-oxygen complexes maintains at least a value of 200 Ω*cm during an annealing process at a temperature between 400° C. and 500° C.

* * * * *